United States Patent
Hübbers et al.

(10) Patent No.: US 9,673,804 B2
(45) Date of Patent: Jun. 6, 2017

(54) CIRCUIT ARRANGEMENT OF ELECTRONIC CIRCUIT BREAKERS OF A POWER GENERATION DEVICE

(75) Inventors: Heiner Hübbers, Krefeld (DE); Eric Hartmann, Kempen (DE)

(73) Assignee: Woodward Kempen GmbH, Kempen (DE)

(*) Notice: Subject to any disclaimer, the term of this patent is extended or adjusted under 35 U.S.C. 154(b) by 323 days.

(21) Appl. No.: 13/548,765

(22) Filed: Jul. 13, 2012

(65) Prior Publication Data
US 2012/0306213 A1    Dec. 6, 2012

Related U.S. Application Data

(63) Continuation of application No. PCT/EP2011/050228, filed on Jan. 10, 2011.

(30) Foreign Application Priority Data

Jan. 14, 2010 (DE) .................. 10 2010 000 082

(51) Int. Cl.
*H03K 17/16* (2006.01)
*H02M 7/00* (2006.01)

(52) U.S. Cl.
CPC ............ *H03K 17/16* (2013.01); *H02M 7/003* (2013.01)

(58) Field of Classification Search
CPC .......... H01F 6/006; H01F 6/02; H01F 7/1811; B66C 1/08; H02B 1/21; H02B 1/00; H01L 24/50; H01L 2023/4062; H01L 2023/4068; H05K 1/0277; H05K 1/0278; H05K 1/028; H05K 1/0281; H05K 1/0283;
(Continued)

(56) References Cited

U.S. PATENT DOCUMENTS 4,381,032 A * 4/1983 Cutchaw .................. 165/46
5,579,217 A * 11/1996 Deam et al. ............. 363/144
(Continued)

FOREIGN PATENT DOCUMENTS

DE       19732402 A1     2/1999
DE     102004042475 A1   3/2006
(Continued)

*Primary Examiner* — Pete Lee
(74) *Attorney, Agent, or Firm* — Reinhart Boerner Van Deuren P.C.

(57) ABSTRACT

The invention relates to a circuit arrangement with an electronic power switch, a capacitor and a plate-shaped direct current laminate. The direct current laminate includes two metal plates insulated from one another for carrying current and multiple connection elements arranged so to electrically connect the metal plates to the capacitor. The capacitor is electrically connected by the connection elements to the direct current laminate, and the capacitor is on one side of the direct current laminate. This circuit arrangement has a significantly reduced space requirement and simultaneously improved scalability. This is achieved because the direct current laminate additionally has multiple connection elements arranged so to connect the direct current laminate to the electronic power switch of the circuit arrangement. The electronic power switch is electrically connected by the connection elements to the direct current laminate and is arranged on the opposing side of the direct current laminate.

17 Claims, 10 Drawing Sheets

(58) Field of Classification Search
CPC ...... H05K 1/0393; H05K 1/118; H05K 1/147; H05K 1/148; H05K 1/189; H05K 2201/042; H05K 2201/046; H05K 2201/05; H05K 1/0204; H05K 1/0206; H05K 1/0207; H05K 1/0209; H05K 1/021; H05K 1/0212; H05K 1/0272; H05K 1/05; H05K 2201/064; H05K 2201/066; H05K 2201/068; H05K 2201/09054; H05K 2201/09772
USPC .................. 361/141, 144, 611, 637; 174/254
See application file for complete search history.

(56) References Cited

U.S. PATENT DOCUMENTS

| | | | | |
|---|---|---|---|---|
| 5,835,354 | A * | 11/1998 | Bug | H05K 7/209 257/724 |
| 5,872,711 | A * | 2/1999 | Janko | 363/144 |
| 6,160,696 | A | 12/2000 | Bailey et al. | |
| 6,822,850 | B2 * | 11/2004 | Pfeifer et al. | 361/611 |
| 6,885,553 | B2 | 4/2005 | Pfeifer et al. | |
| 7,071,579 | B2 * | 7/2006 | Erdman et al. | 290/55 |
| 7,256,492 | B2 * | 8/2007 | Kim | 257/706 |
| 7,709,737 | B2 * | 5/2010 | Keegan | H02G 5/005 174/520 |
| 8,035,982 | B2 * | 10/2011 | Kontani | H01L 23/642 361/611 |
| 2002/0001177 | A1 * | 1/2002 | Petitbon | 361/690 |
| 2002/0025709 | A1 | 2/2002 | Murakami | |
| 2003/0031038 | A1 | 2/2003 | Shirakawa et al. | |
| 2004/0208030 | A1 | 10/2004 | Bhate et al. | |
| 2006/0007721 | A1 | 1/2006 | Rodriguez et al. | |
| 2009/0219696 | A1 * | 9/2009 | Nakayama et al. | 361/709 |

FOREIGN PATENT DOCUMENTS

| | | |
|---|---|---|
| JP | 10201249 A | 7/1998 |
| JP | 2008245451 A | 10/2008 |

* cited by examiner

CIRCUIT ARRANGEMENT OF ELECTRONIC CIRCUIT BREAKERS OF A POWER GENERATION DEVICE

CROSS-REFERENCE TO RELATED PATENT APPLICATIONS

This patent application is a continuation of pending PCT Application No. PCT/EP2011/050228, filed Jan. 10, 2011, which claims the benefit of German Application No. 10 2010 000 082.5, filed Jan. 14, 2010, the entire teachings and disclosure of which are incorporated herein by reference thereto.

FIELD OF THE INVENTION

The invention relates to a circuit arrangement with at least one electronic circuit breaker, at least one capacitor and a plate-shaped direct current laminate, the direct current laminate having at least two metal plates insulated against one another for carrying current and a plurality of connection elements arranged at a first spacing to electrically connect the metal plates to the at least one capacitor, the at least one capacitor being electrically connected by the connection elements arranged at the first spacing to the direct current laminate and the at least one capacitor being arranged on one side of the direct current laminate.

BACKGROUND OF THE INVENTION

Circuit arrangements with electronic power switches, in other words electronic switches, such as, for example, diodes, transistors, insulated gate bipolar transistors (IGBT), integrated gate commutated thyristors (IGCT) or modules with these components and capacitors are frequently used in devices for generating power, for example in a rectifier or inverter of a wind energy plant, a photovoltaic plant or in other power generators with inverter technology. The at least one capacitor, generally a plurality of capacitors, is used to provide a direct voltage intermediate circuit. By switching the electronic switch on and off, alternating current is converted into direct current or the other way round. When switching the electronic power switches on and off, high switching speeds are required in order to keep power losses low overall. As a result, large power variations are produced, which induce voltages which should be kept as low as possible. For this purpose it is necessary to keep the inductivity of the connections between the switches and the direct voltage intermediate circuit as small as possible. For this reason, the electronic power switches are connected to the capacitors by direct current laminates, which are kept as thin, flat and wide as possible, so large overlap regions are produced, in which currents flowing in the opposite direction are closely adjacent and the magnetic fields produced overlap one another. This means that the magnetic fields generated eliminate one another so the inductance of the current-carrying components is very low.

A circuit arrangement of this type is known from the German patent DE 197 32 402 B4 and has a direct current laminate consisting of two metal plates arranged adjacently and insulated with respect to one another, which is used to connect electronic power switches to a capacitor bank. The capacitors are electrically connected by a plurality of connection elements, which are arranged at a first spacing, to the direct current laminate and arranged on one side of the direct current laminate. The electronic power switches are arranged angled in the circuit arrangement known from the prior art, so the electronic power switches are arranged next to the direct current laminate. The electronic power switches are furthermore electrically connected to connection extensions of the direct current laminate. This arrangement has the drawback that, on the one hand, the direct current laminates have to be individually adapted to the embodiments of the electronic power switches, so when using electronic power switches of different producers and design, different direct current laminates have to be constructed and produced. On the other hand, the use of space of this circuit arrangement is not optimal. An aim in the construction of corresponding circuit arrangements is, however, to achieve as compact a structure as possible in order to minimise the space requirement. Finally, the known circuit arrangement cannot readily be scaled to higher powers.

Proceeding from this, the present invention is based on the object of providing a circuit arrangement, which has a significantly reduced space requirement and simultaneously improved scalability. Moreover, a power generation device with a correspondingly small space requirement is to be proposed.

BRIEF SUMMARY OF THE INVENTION

According to the invention, the object derived above for a circuit arrangement is achieved in that the direct current laminate additionally has a plurality of connection elements arranged at a second spacing to connect the direct current laminate to at least one electronic power switch of the circuit arrangement, in that at least one electronic power switch is electrically connected by the connection elements arranged at the second spacing to the direct current laminate and is arranged on the opposing side of the direct current laminate.

The direct current laminate is located according to the invention between the electronic power switches and the capacitors, so that the space on the two sides of the plate-shaped direct current laminate is particularly effectively utilised. Moreover, the connection elements, which are arranged at the second spacing, of the direct current laminate allow variable connection of one, but also of a plurality of, electronic power switches on the direct current laminate, so easy scalability of the circuit arrangement is provided. All the connection elements are preferably formed by contact holes in the respective metal plate of the electric connection pole of the direct current laminate, so the individual capacitors and electronic power switches can be electrically conductively connected to the direct current laminate. The first spacing and the second spacing may either be formed identically or differently from one another.

According to a first embodiment of the circuit arrangement according to the invention, a plurality of capacitors connected in parallel, preferably a capacitor bank, is provided, the individual capacitors being electrically conductively connected by the connection elements arranged at the first spacing to the direct current laminate. The first spacing of the direct current laminate allows a particularly compact arrangement of the capacitors as the spacing can be matched, for example, to the size and the space requirement of the capacitors.

A further advantageous embodiment of the circuit arrangement according to the invention is achieved in that the connection elements of the direct current laminate arranged at the second spacing are configured in such a way that a plurality of electronic power switches can be electrically conductively connected in an axially symmetrical arrangement to the direct current laminate. For the connection elements arranged at the second spacing, this means that the electric connection poles, for example, allow the contacting of an electronic power switch rotated through 180 degrees. The axially symmetrical arrangement of electronic power switches allows a symmetrical structure of the circuit arrangement and, to this extent, a further reduction in the space requirement.

The alternating current connections of the power switches can be realised, in a further embodiment of the circuit arrangement, by means of busbars, for example by copper busbars or cables. The conductor busbars may run, for this purpose, on one or both sides of the power switches or else along the axis of symmetry of the power switch arrangement. This depends on the respective connection geometry of the alternating current connections of the power switch and the space conditions in the installed state of the circuit arrangement.

According to a developed embodiment of the circuit arrangement according to the invention, the second spacing of the direct current laminate allows a horizontal or a vertical arrangement or lining up of electronic power switches. Both arrangement variants of the electronic power switches, in other words vertical or horizontal, can also be made possible by a single direct current laminate. As a result, a maximum amount of flexibility is achieved as, depending on the space available, the electronic power switches can be arranged on the direct current laminate in a vertical or horizontal direction, without the direct current laminate having to be newly constructed.

A simple use of electronic power switches of different producers and designs with different connection geometries, without essential parts of the circuit arrangement, in particular the direct current laminate, having to be newly constructed, is achieved according to a further embodiment of the circuit arrangement according to the invention in that an adapter laminate is provided to connect the electronic power switches, the adapter laminate having connection elements adapted to the electronic power switches on one connection side and connection elements adapted to the second spacing on the other connection side. By using adapter laminates, electronic power switches of different producers and designs can be used particularly easily with the same direct current laminate. The adapter laminates are also constructed in such a way that the two current-carrying layers are kept as thin, flat and wide as possible, so large overlap regions are produced. Generally, the electronic power switches are electrically conductively connected, for example, via the adapter laminates to the direct current laminate by screw connections.

A further configuration of the circuit arrangement according to the invention reduces the assembly outlay in that the connection elements of the direct current laminate arranged at the second spacing have sleeves with an internal thread. For assembly, a screw only has to be screwed to the sleeve of the direct current laminate from the side of the electronic power switch. The sleeves may be connected to the direct current laminate by material bonding, form fit or force fit. Connections by material bonding may be provided by soldering, gluing and welding. A combination of the force-fit and form-fit connections can be provided in a simple manner by pressing the sleeves into the direct current laminate.

The two metal plates of the direct current laminate or of the adapter laminate are naturally located in two different planes. Therefore, contact sleeves, which connect the metal plates located at different depths, of the same potential to one another, are frequently used during the contacting. According to a further configuration of the circuit arrangement according to the invention, the contact faces of the connection elements, which are arranged at the second spacing, of the direct current laminate and/or the connection elements, which are adapted to the second spacing, of the adapter laminate are arranged in one plane so the use of contact sleeves can be dispensed with for contacting the contact faces of the metal plates of the adapter laminate and direct current laminate.

A particularly simple adapter laminate allows the arrangement of electronic power switches on one side of the direct current laminate, in that the cross-sectional shape of the adapter laminate has at least one right angle. The electronic power switches may, in this case, be arranged in such a way that the cooling faces are oriented perpendicular to the plane of the direct current laminate and a heat dissipation that is independent of the direct current laminate and the capacitors arranged on the opposing side of the direct current laminate is made possible.

A further cost reduction and, moreover, a clear simplification of the structure of the circuit arrangement is achieved according to a next configuration of the circuit arrangement according to the invention in that electronic power switches arranged on one side of the direct current laminate have a common cooling body. This saves the costs for additional cooling bodies.

The use of a common cooling body is advantageous in particular when the cooling body is cooled by a liquid cooling medium and is optionally modularly constructed. With the common utilisation of a cooling body cooled by a liquid cooling medium, above all additional connections and therefore potential leakage points are avoided with the circuit arrangement according to the invention and to this extent, not only is a clear reduction in the space requirement achieved, but the operating reliability is also increased to a substantial degree. Optionally, the cooling bodies may also be modularly constructed. Modular in the sense of the present invention means that the cooling bodies may, for example, be associated, with individual electronic power switches or else groups of power switches and with the combination of various electronic power switch groups, can also easily be connected to further cooling bodies to provide adequate cooling for the circuit arrangement.

Further costs are thus saved in the development of the cooling bodies and the construction.

According to a preferred embodiment of the circuit arrangement, the cooling bodies in each case have separate coolant connections, which, for example, can be provided by means of adapters. As a result, a structural unit consisting of a cooling body, power switch and adapter laminate can be formed, which because of the lower weight, facilitates the assembly and exchange of individual power switches of the circuit arrangement.

The individual structural units consisting of power switches, cooling bodies and the adapter laminate may not only be constructed, as already stated, axially symmetrically or mirror-symmetrically. The individual structural units also, in particular, allow a simple, parallel arrangement, for example in a plurality of rows, on the adapter laminate. Although a larger direct current laminate is generally required as a result, which, for example, consists of one large or a plurality of small direct current laminates, the arrangement of the structural units formed of this embodiment of the circuit arrangement in particular facilitates the exchange of structural units and allows improved scalability of the circuit arrangement. The structural units may, for example, be arranged vertically or horizontally one behind the other on the direct current laminate for this purpose.

It may be advantageous in a specific application, instead of liquid cooling, to use air cooling. Air is forced to flow through the common cooling body here. The optional modularity of the cooling bodies is also advantageous in this case and leads to better scalability.

According to a further configuration of the circuit arrangement according to the invention, a plurality of direct current laminates are provided, which are electrically conductively connected to one another by connection means provided in each case in the direct current laminate. This means that the direct current laminates can be extended as desired in accordance with the desired number of electronic power switches. The connection means may allow an extension of the direct current laminate both in the vertical and in the horizontal direction and, for this purpose, are arranged at the corresponding points of the direct current laminate.

If, according to a further configuration of the circuit arrangement according to the invention, the first and/or the second spacing of the connection elements of the direct current laminate takes into account different capacitor and/or power switch connection geometries, for example in that the connection elements can be selected such that different connection distances are available at the respective first or second spacing, without using adapter laminates, connection geometries of different producers can be taken into account and used without structural outlay.

At least one transistor, preferably at least one insulated gate bipolar transistor (IGBT) module, integrated gate commutated thyristor (IGCT), diodes and/or at least one chopper module (22) are preferably provided as the electronic power switch. These electronic power switches are generally used in devices to generate power, for example convertors with capacitive intermediate circuits. A combination of at least one electronic power switch, for example a transistor and at least one resistor is called a chopper module. The chopper module is used to short-circuit the intermediate circuit for a short time and to thus protect other electronic power switches, for example the IGBT modules or else the capacitors from excess voltages.

The chopper module, according to a further embodiment, can either be directly electrically connected to the direct current laminate or be attached by a specific adapter laminate to the direct current laminate. If the chopper module is directly connected to the direct current laminate, the costs for an adapter laminate are saved, on the one hand. The adapter laminate may, however, be used to arrange the chopper module at a suitable point of the circuit arrangement, in a manner specific to the application, without the direct current laminate having to be changed.

Electronic power switches, in particular IGBT modules for three phases are preferably provided. For example, an inverter can be constructed on the input and output side with three respective electronic power switches. In the area of building equipment or the provision of a single-phase alternating current, circuit arrangements with two electronic power switches on the output side are, however, also conceivable.

The object derived above is, moreover, achieved by a power generation device with an inverter or rectifier, which comprises a circuit arrangement according to the invention. As already stated, corresponding inverters or rectifiers have a particularly small space requirement and can be adapted to different power requirements at very low costs.

This applies, in particular, to a power generation device of a wind energy plant with a generator, which has a rectifier or inverter, for which a circuit arrangement according to the invention is provided. Double-fed asynchronous machines, but also synchronous machines, are used, for example, as generators in wind energy plants. Wind energy plants are constructed in the most varied power units so the converters regularly have to be adapted to the corresponding power of the wind energy plant. This succeeds particularly economically with the circuit arrangement according to the invention. Furthermore, the space requirement in a wind energy plant is mostly limited, so the compact structure of the circuit arrangement is advantageous. In particular when using synchronous machines with full-scale converter technology, high powers are carried by the circuit arrangement according to the invention, so a compact and scalable structure of the circuit arrangement is particularly advantageous.

BRIEF DESCRIPTION OF THE DRAWINGS

The invention will be described in more detail below with the aid of the description of exemplary embodiments in conjunction with the drawings, in which.

DETAILED DESCRIPTION OF THE INVENTION

Figure 1:
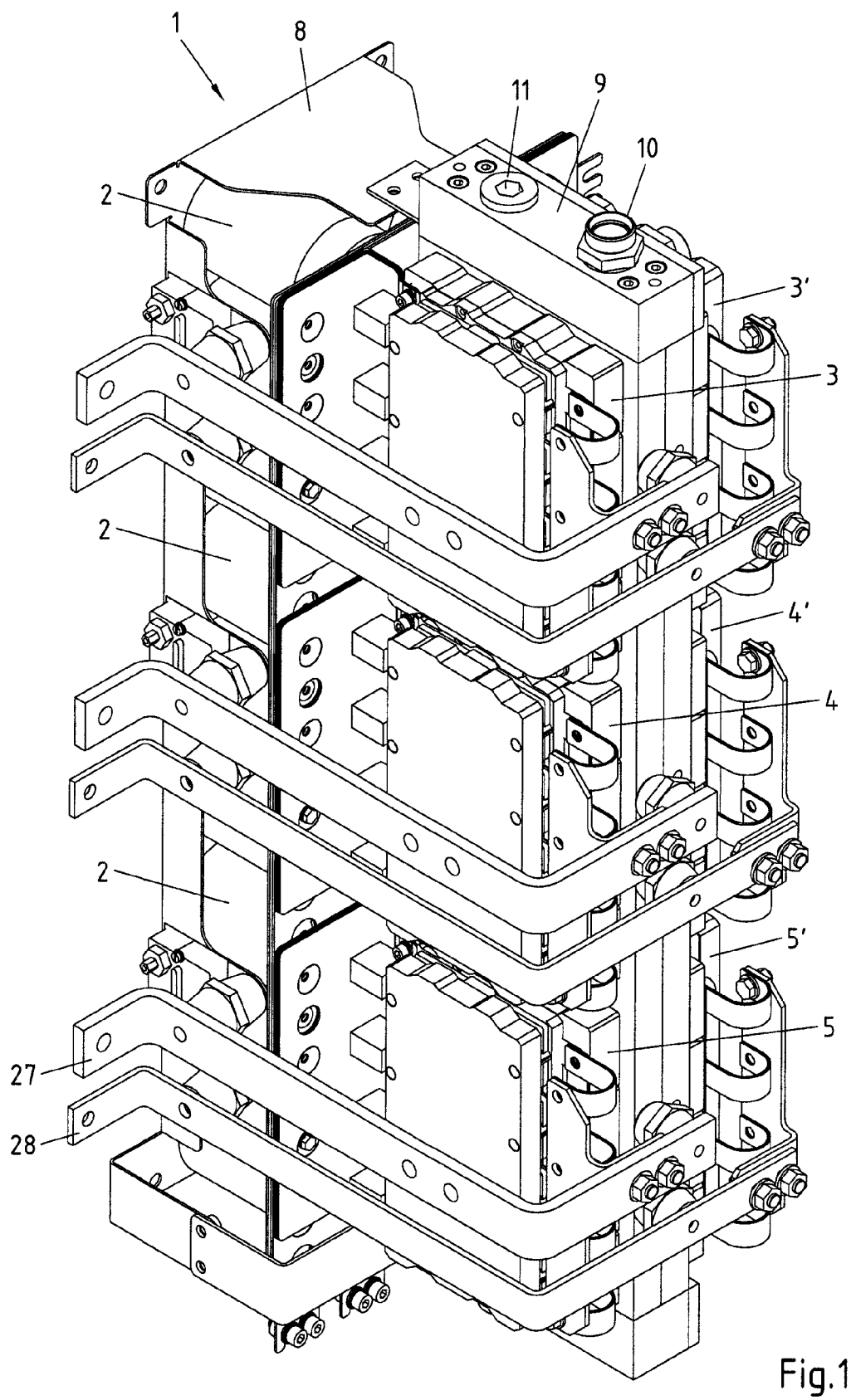
FIG. 1 shows a perspective view of a first exemplary embodiment of the circuit arrangement according to the invention with a capacitor bank and a plurality of electronic power switches.

FIG. 1 shows a perspective view of an exemplary embodiment of the circuit arrangement 1 according to the invention, with a plurality of capacitors 2, a total of six electronic power switches in the form of IGBT modules 3, 3', 4, 4', 5, 5'. The IGBT modules 3, 3', 4, 4', 5, 5' are electrically conductively connected by the direct current laminate 6 to the capacitors 2 of the capacitor bank 8 using adapter laminates 7.

As can be seen in FIG. 1, a cooling body 9, which has an inlet opening 10 and an outlet opening 11 for a cooling medium, is arranged between the axially symmetrically arranged IGBT modules 3, 4, 5 and 3', 4', 5'. The outlet opening for the cooling medium may be arranged at the side of the cooling body (not shown) opposing the inlet opening 10, but may also, as shown, be arranged on the same side. As can be seen from FIG. 1, a particularly compact structure of the circuit arrangement 1 is produced by the axially symmetrical arrangement of the electronic power switches with the cooling body located in between. Moreover, it can be seen that to adapt the circuit arrangement to different functionalities or powers, capacitors or electronic power switches, for example, can be removed or replaced by other electronic power switches. Thus, it is easily possible, for example, to replace the IGBT modules 3', 4', 5' by diodes in order, instead of a 4-quadrant converter, to realise a 2-quadrant converter. A structural change of the circuit arrangement is not necessary for this. A two-phase structure of the power switches is also conceivable, for example in the area of building equipment to generate single-phase alternating current.

The alternating current connections of the IGBT modules 3, 4, 5, 3', 4', 5' are realised in the exemplary embodiment shown by copper busbars 27, 28, which allow a one-sided alternating current supply. However, other geometric arrangements of the copper busbars, for example on both sides of the IGBT modules 3, 4, 5, 3', 4', 5' or centrally along the axis of symmetry of the IGBT modules 3, 4, 5, 3', 4', 5', but also a realisation of the alternating current connections by cables (not shown in each case) are also conceivable.

Figure 2:
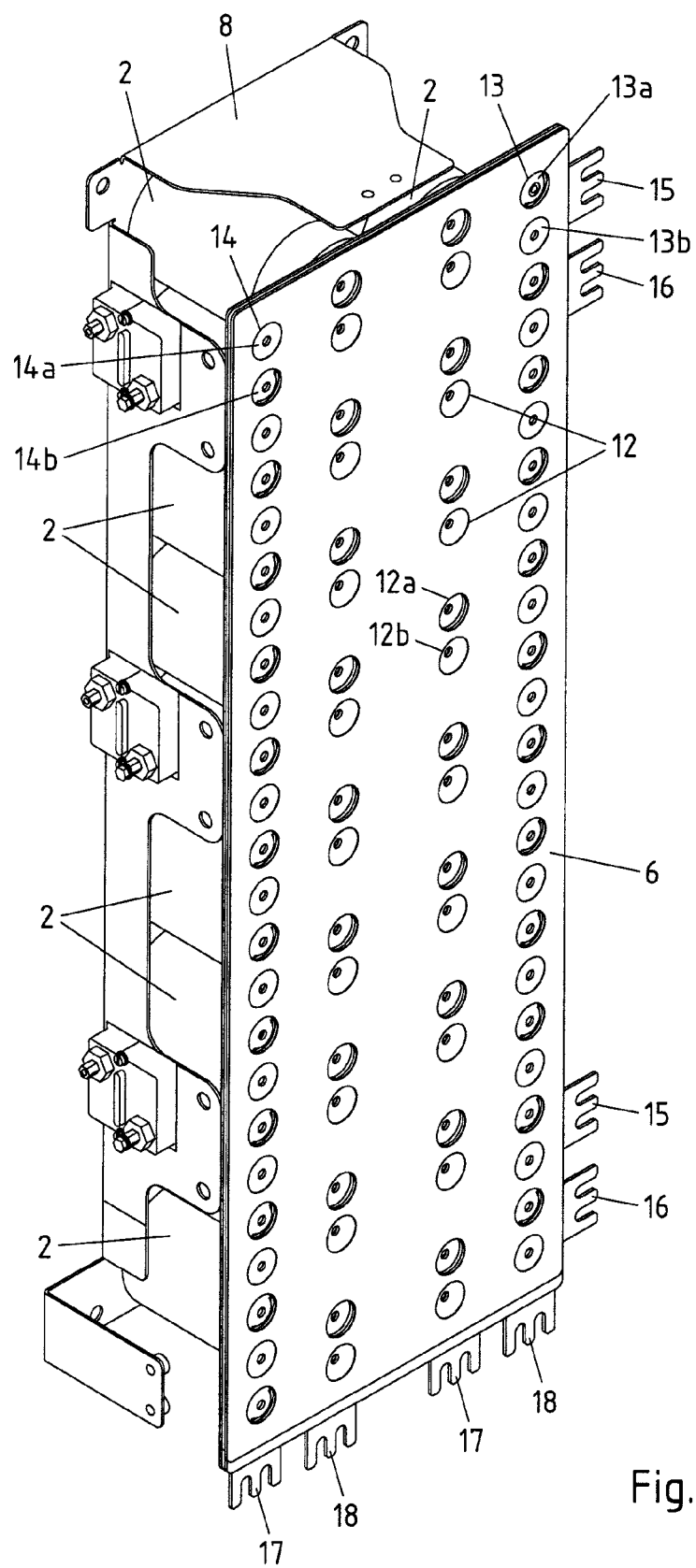
FIG. 2 shows a perspective view of the direct current laminate from the first exemplary embodiment.

FIG. 2 now shows the direct current laminate 6 and the associated capacitors 2 in a perspective view. The direct current laminate 6 has connection elements 12, which are arranged at a first spacing and which are used to connect the individual capacitors 2 of the capacitor bank 8. The first spacing is therefore adapted to the size and connection distances of the capacitors.

Moreover, the direct current laminate has a plurality of connection elements 13, which are arranged at a second spacing and are used to electrically connect the electronic power switches, in the present case the IGBT modules 3, 4, 5, 3', 4', 5' to the direct current laminate 6. FIG. 2 shows the different electrical poles, in other words the positive terminal and the negative terminal of the connection elements 12, 13, in each case by means of connection elements 12a, 12b, 13a, 13b of the direct current laminate 6, which are shown differently recessed. The connection elements 13 are arranged with respect to the polarity in such a way that an axially symmetrical arrangement of a plurality of power modules, as shown in the first exemplary embodiment, can be electrically connected to the direct current laminate 6. A particularly compact structure of the circuit arrangement 1 is thus achieved.

In the present exemplary embodiment, this achieved in that opposing connection elements 13, 14 arranged at the second spacing have different electrical polarities. Using adapter laminates, this allows an arrangement of the IGBT modules 3, 4, 5, 3', 4', 5' on one side of the direct current laminate 6 such that the cooling faces of the IGBT modules are arranged perpendicular to the direct current laminate and opposing.

Moreover, the direct current laminate 6 shown in FIG. 2 by way of example shows further connection means 15, 16, 17 and 18 to connect further direct current laminates either in the horizontal direction or in the vertical direction. The circuit arrangement 1 can be scaled still more flexibly as a result.

Figure 3:
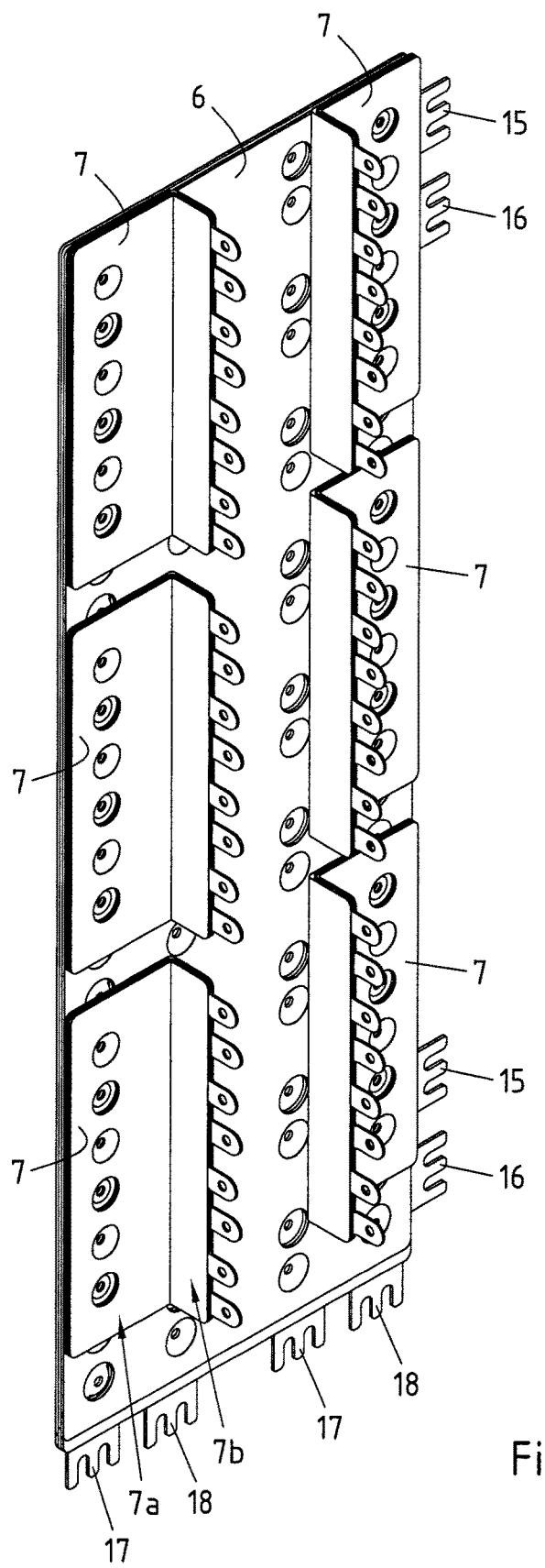
FIG. 3 shows a perspective view of the direct current laminate together with the adapter laminates from the first exemplary embodiment.

FIG. 3 now shows the direct current laminate 6 with a total of six adapter laminates 7 in a perspective view. According to the invention, the adapter laminate 7 has two connection regions, namely the side 7a facing the direct current laminate 6 and the connection side 7b facing the electronic power switches. The connection side 7a of the adapter laminate 7 is adapted to the second spacing of the connection elements of the direct current laminate 6 and, at the other end, the connection side to the electronic power switches 7b has additional connection elements, which are specifically adapted to the electronic power switches. Electronic power switches of different producers with a different connection configuration may be used in that only the adapter laminate 7 is adapted to the connection geometry. The direct current laminate 6 remains unchanged. It is also obvious that the connection points 13, 14, which are arranged at the second spacing, of the direct current laminate 6 are already arranged in such a way that the electronic power switches can also be directly connected to the direct current laminate.

The adapter laminates 7 ensure that the connection elements 13, 14 can also be used with electronic power switches of different producers. As can be seen in FIG. 3, the adapter laminates have a right angle, so these easily allow the electronic power switches 3, 4, 5, 3', 4', 5' to be arranged with opposing cooling faces, so that a single cooling body 9 is sufficient to cool a plurality of electronic power switches. Moreover, it can be seen from FIG. 3 that the adapter laminates 7 in their form shown have a particularly low inductance and therefore are ideally suited to carry high current peaks.

Figure 4:
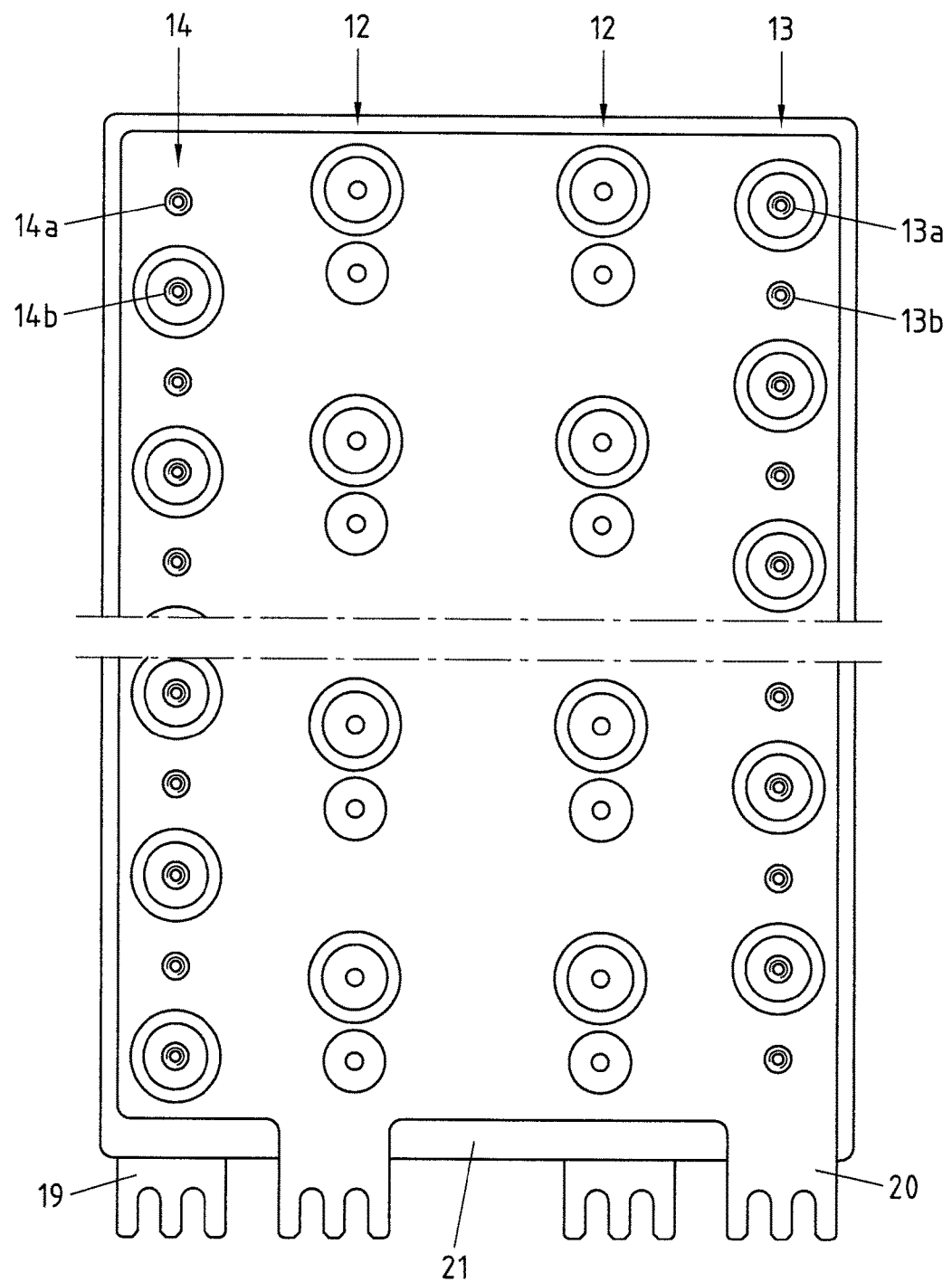
FIG. 4 shows a plan view of the direct current laminate from the first exemplary embodiment.

FIG. 4 again shows the structure of the direct current laminate, which substantially consists of two current-carrying metal plates 19, 20, between which an insulating layer 21 is arranged. Moreover, the direct current laminate is optionally provided on both sides with an insulating layer, which is not shown in FIG. 4. In addition, the different spacing of the connection elements 12 can be seen in comparison to the connection elements 13 and 14. Different connection poles of the direct current laminate are shown with connection elements of different sizes.

It can furthermore be seen that the connection elements 13a and 14a or 13b and 14b respectively, which are arranged in the same plane, of the connection elements 13, 14 arranged at the second spacing in each case have a different polarity and therefore allow the connection of axially symmetrically arranged electronic power switches. The electronic power switches are arranged, for this purpose in a position rotated through 180 degrees, in each case, as shown in FIG. 1. However, it is also conceivable for the polarity of the connection elements to be made identical and to adapt the adapter laminates 7 in such a way that they allow the axially symmetrical arrangement of the electronic power switches. However, this would require two different adapter laminates 7.

Figure 5:
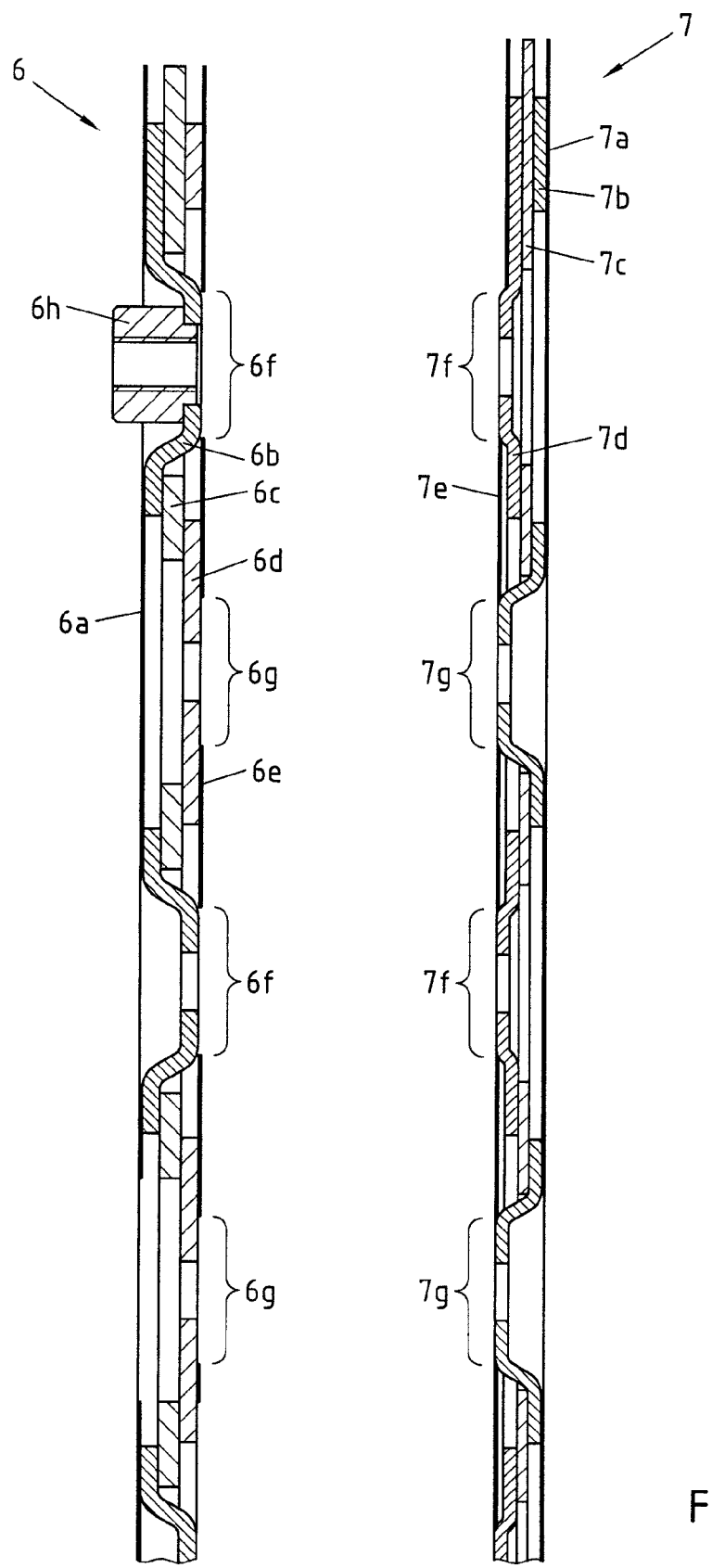
FIG. 5 shows a sectional view of the direct current laminate in the region of the adapter laminates.

FIG. 5 now shows the direct current laminate 6 and the adapter laminate 7 in a sectional view. The direct current laminate consists of the current-carrying metal plates 6b and 6d with an insulating layer 6c arranged in between and optionally two outer insulating layers 6a and 6e. The adapter laminate 7, the current-carrying metal plates of which are designated 7b and 7d, the insulating layer located in between is designated 7c and the optional outer insulating layers are designated 7a and 7e, also has a similar structure. The contacting of the corresponding connection pole of the direct current laminate 6 or the adapter laminate 7 takes place by means of the contact faces 6f, 6g and 7f, 7g. When using outer insulating layers 6a, 6e, 7a and 7e, gaps in the insulating layer are to be provided at the contact points.

As can also be seen in FIG. 5, the metal plates are formed in such a way that the contact faces 6f and 6g of the direct current laminate 6 and 7f and 7g of the adapter laminate 7 are in each case located in a plane. This makes it possible to directly connect the direct current laminate to the adapter laminate without having to use additional elements such as metal sleeves to compensate different heights.

Screws with nuts may be used, for example, for the electrical and force-fit and form-fit connection of the two laminates. Press-in sleeves with an internal thread 6h, which can optionally be used instead of a nut, also prove to be advantageous. These sleeves 6h are, for example, pressed into the direct current laminate 6. This provides advantages during assembly, as the adapter laminate can be screwed to the direct current laminate with one hand and therefore a rapid and simple assembly or exchange for service purposes is made possible. As already stated, the sleeves 6h may be connected bay material bonding, force fit or form fit to the direct current laminate 6. The pressing in of the sleeves 6h is a combination of a force-fit and form-fit connection.

Figure 6:
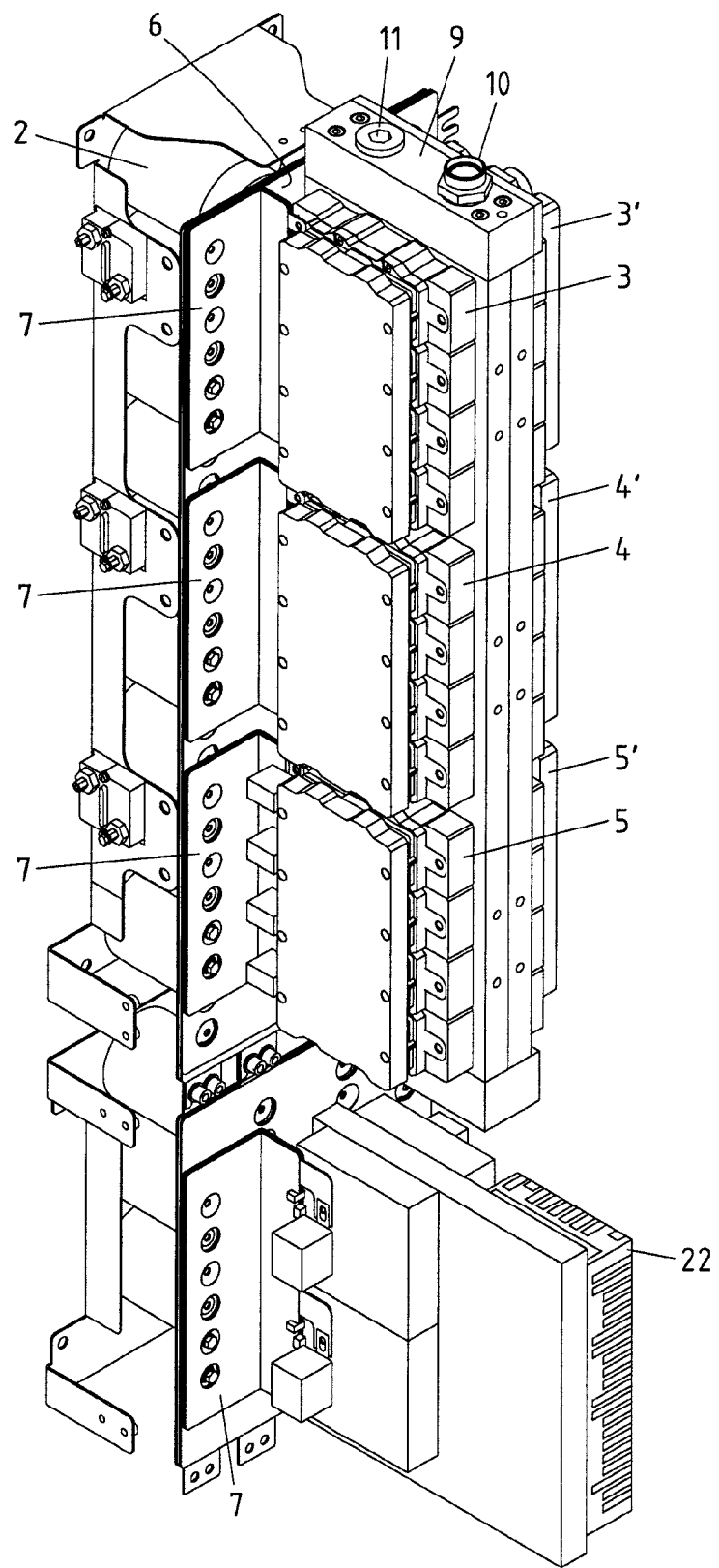
FIG. 6 shows a perspective view of a second exemplary embodiment of the circuit arrangement according to the invention with IGBT modules and a chopper module.

FIG. 6 now shows a perspective view of the circuit arrangement according to the invention from FIG. 1, which has been extended by an additional module, the chopper module 22. The chopper module 22 is used to protect the capacitors 2 and the IGBT modules 3, 4, 5, 3', 4', 5' from excess voltages. The combination of the IGBT modules 3, 4, 5, 3', 4', 5' with a chopper module 22 additionally arranged on the direct current laminate 6 allows the chopper module to be directly attached to the capacitor bank. A cable connection between the direct current laminate 6 and the chopper module 22 is therefore dispensed with. As the intermediate circuit voltage is regularly above 1000V, this is advantageous both from the point of view of safety and also with regard to the electromagnetic compatibility of the circuit arrangement. Furthermore, a reduction in the space requirement is produced.

Figure 7:
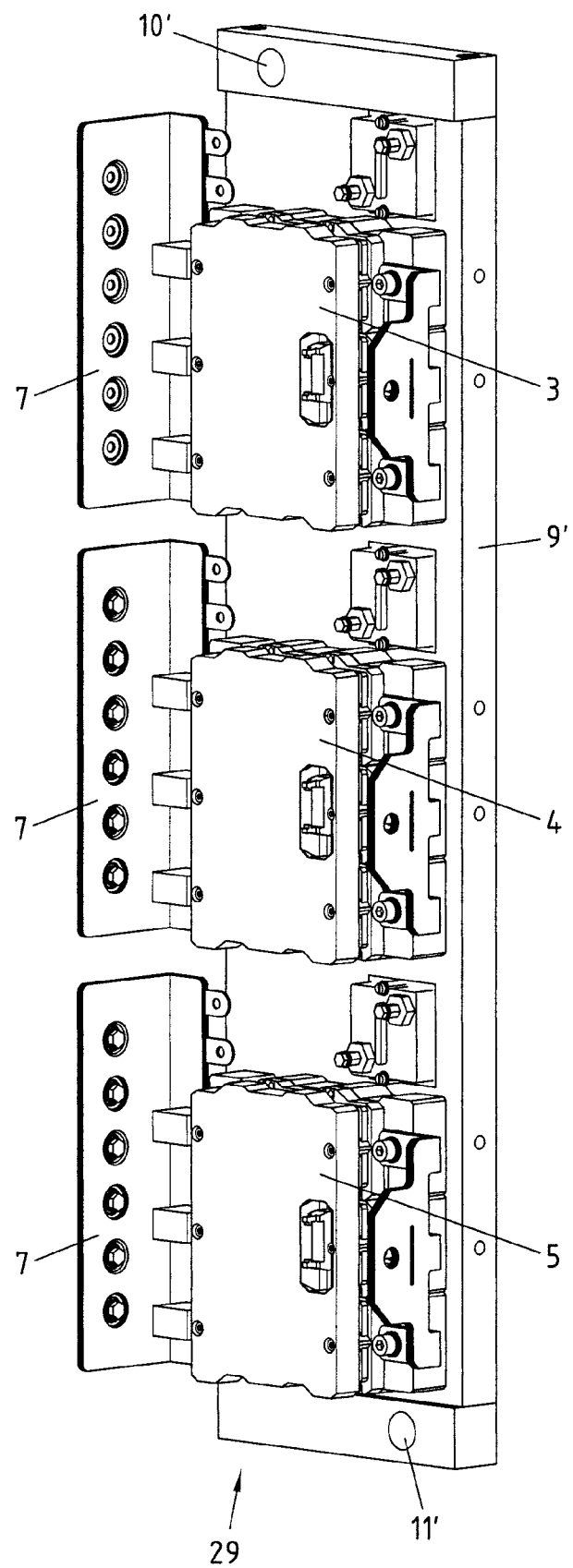
FIG. 7 shows a structural unit consisting of power switches, cooling bodies and adapter laminates according to a third exemplary embodiment.

A structural unit 29 consisting of power switches 3, 4, 5 with associated separate cooling bodies 9' and adapter laminates 7 is shown in a perspective view by FIG. 7. The coolant connections 10' and 11' are configured laterally, so that adequately large connection geometries can be provided regardless of the depth of the cooling body. The cooling body 9' is a separate cooling body but it is constructed modularly in the sense of the present invention, as it can be combined with other mirror-symmetrically arranged cooling bodies and can therefore also be associated with one or a plurality of other power switches 3, 4, 5.

Figure 8:
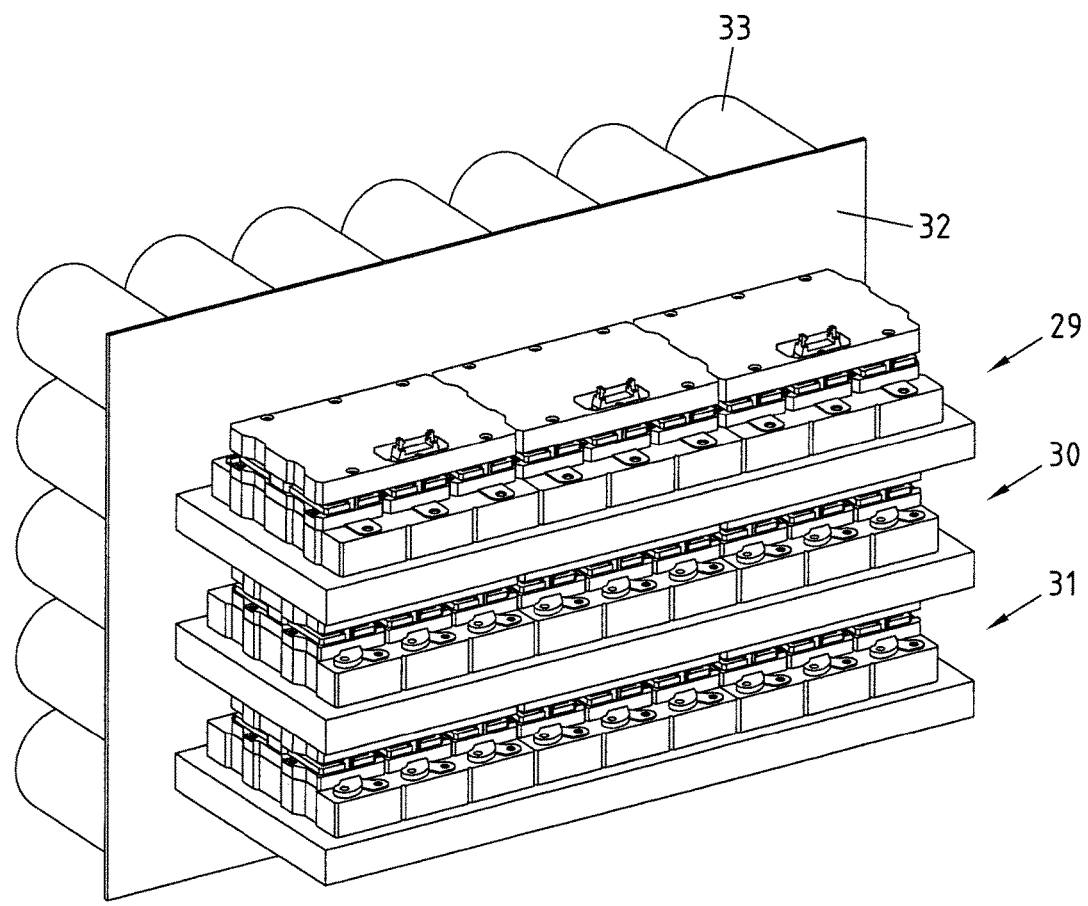
FIG. 8 shows a fourth exemplary embodiment of the circuit arrangement with a plurality of structural units according to FIG. 7.

The structural unit 29 consisting of power switches 3, 4, 5, the cooling body 9' and the adapter laminates 7 can be arranged on a "large" direct current laminate 32 together with other structural units 30, 31 in parallel in a horizontal or vertical direction. FIG. 8 shows this in a different embodiment. The direct current laminate 32 may consist of a single continuous direct current laminate or of direct current laminates electrically connected to one another (not shown). The connection of the direct current laminates is optionally also provided by adapter laminates. The capacitors 33 are arranged on the rear of the direct current laminate 32. In the circuit arrangement shown in FIG. 8, a single structural unit 29, 30, 31 can easily be replaced if it is defective, for example. However, a scalability is very easily possible by adding or removing the structural units 29, 30, 31.

Figure 9:
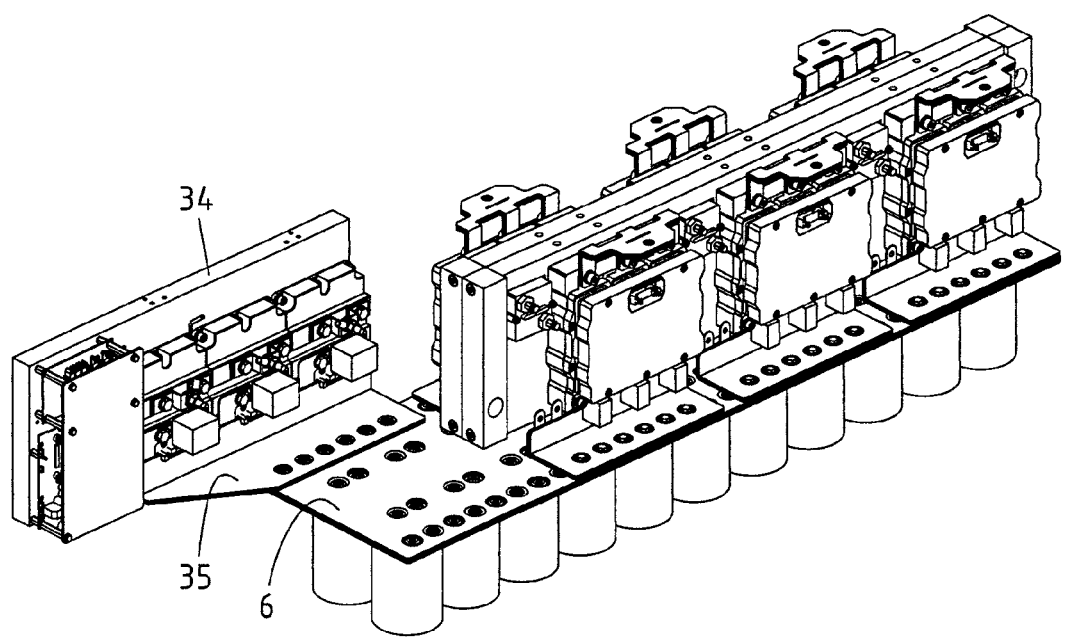
FIG. 9 shows a further exemplary embodiment with a chopper module connected by an additional adapter laminate and FIG. 10 shows a schematic view of a wind energy plant with a circuit arrangement according to the invention.

FIG. 9 shows a perspective view of a further exemplary embodiment with a chopper module 34, which is attached to the direct current laminate 6 by an additional adapter laminate 35. The possibility thus exists here of arranging the chopper module 34 more flexibly in the circuit arrangement.

Figure 10:
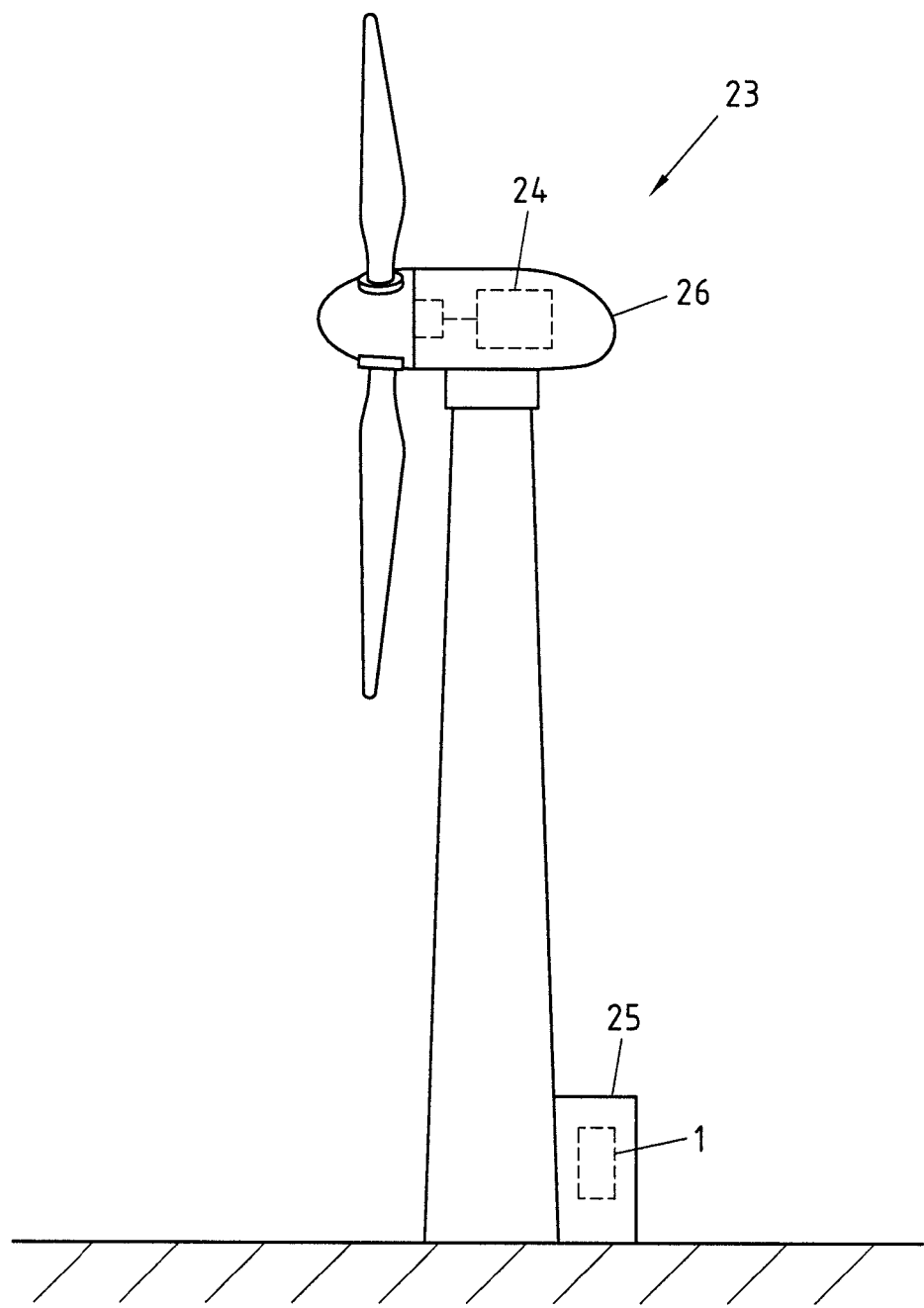

FIG. 10 now schematically shows a wind energy plant 23 with a generator 24 and a circuit arrangement 1 according to the invention. The circuit arrangement 1 is mounted in a switch cabinet 25 at the foot of the wind energy plant. The circuit arrangement 1 is, however, also frequently arranged close to the generator 24, in other words, for example in the nacelle 26 of the wind energy plant 23. Because of the small amount of space available in wind energy plants, in particular in the turret of the wind energy plant 23, and the necessary adaptation of the wind energy plants 23 to different power ranges, the use of the circuit arrangement 1 according to the invention for wind energy plants 23 is particularly advantageous.

The invention claimed is:

1. A circuit arrangement comprising at least one electronic power switch, at least one capacitor and a plate-shaped direct current laminate, the direct current laminate having at least two metal plates insulated from one another for carrying current and a plurality of connection elements arranged at a first spacing to electrically connect the metal plates to the at least one capacitor, the at least one capacitor being electrically conductively connected by the connection elements arranged at the first spacing to the direct current laminate and the at least one capacitor being arranged on one side of the direct current laminate, wherein the direct current laminate additionally has a plurality of connection elements arranged at a second spacing to connect the direct current laminate to at least one electronic power switch of the circuit arrangement, in that at least one electronic power switch is electrically connected by the connection elements arranged at the second spacing to the direct current laminate and is arranged on the opposing side of the direct current laminate, wherein at least one adapter laminate is provided to connect the electronic power switches, the adapter laminate having connection elements adapted to the electronic power switches on one connection side and having connection elements adapted to the second spacing on the other connection side and wherein an entirety of the adapter laminate comprises only two current carrying layers and wherein the electronic power switches arranged on one side of the direct current laminate at least partially have a common cooling body.

2. The circuit arrangement according to claim 1, wherein a plurality of capacitors connected in parallel, preferably a capacitor bank, is provided and the individual capacitors are electrically conductively connected by the connection elements arranged at a first spacing to the direct current laminate.

3. The circuit arrangement according to claim 1, wherein the connection elements, which are arranged at the second spacing, of the direct current laminate are arranged such that a plurality of electronic power switches can be electrically conductively connected in an axially symmetrical arrangement to the direct current laminate.

4. The circuit arrangement according to claim 1, wherein the connection elements, which are arranged at the second spacing, of the direct current laminate have sleeves with an internal thread.

5. The circuit arrangement according to claim 1, wherein the cross-sectional shape of the adapter laminate has at least one right angle.

6. The circuit arrangement according to claim 1, wherein contact faces of the connection elements, which are arranged at the second spacing, of the direct current laminate are arranged in one plane.

7. The circuit arrangement according to claim 1, wherein contact faces of the connection elements, which are adapted to the second spacing, of the adapter laminate are arranged in one plane.

8. The circuit arrangement according to claim 1, wherein the common cooling body is modularly constructed.

9. The circuit arrangement according to claim 1, wherein the common cooling body cools by air.

10. The circuit arrangement according to claim 9, wherein the common cooling body cools by a liquid cooling medium.

11. The circuit arrangement according to claim 1, wherein the common cooling body associated with a power switch or a group of power switches in each case of the common cooling body has separate coolant connections.

12. The circuit arrangement according to claim 1, wherein a plurality of direct current laminates are provided, which are electrically conductively connected to one another by respective connection means provided in the direct current laminate.

13. The circuit arrangement according to claim 1, wherein at least one of the first and/or the second spacing of the direct current laminate takes into account different capacitor or power switch connection geometries.

14. The circuit arrangement according to claim 1, wherein the electronic power module is selected from the group consisting of at least one transistor, preferably at least one insulated gate bipolar transistor (IGBT) module, integrated gate commutated thyristor (IGCT), diodes and at least one chopper module.

15. The circuit arrangement according to claim 1, wherein electronic power switches, in particular IGBT modules for three phases, are provided.

16. A power generation device with an inverter or rectifier comprising a circuit arrangement according to claim 1.

17. The power generation device according to claim 16, wherein the power generation device is a wind energy plant with a generator, which has either a rectifier or an inverter and either the rectifier or inverters have the circuit arrangement.

* * * * *